United States Patent
Jang et al.

(10) Patent No.: US 8,865,375 B2
(45) Date of Patent: Oct. 21, 2014

(54) HALFTONE PHASE SHIFT BLANK PHOTOMASKS AND HALFTONE PHASE SHIFT PHOTOMASKS

(71) Applicant: Samsung Electronics Co., Ltd., Suwon-si (KR)

(72) Inventors: Il-Yong Jang, Yongin-si (KR); Hoon Kim, Suwon-si (KR); Hye-Kyoung Lee, Incheon (KR); Sang-Gyun Woo, Yongin-si (KR); Dong-Seok Nam, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 11 days.

(21) Appl. No.: 13/706,978

(22) Filed: Dec. 6, 2012

(65) Prior Publication Data

US 2013/0101926 A1 Apr. 25, 2013

Related U.S. Application Data

(63) Continuation of application No. 12/909,395, filed on Oct. 21, 2010, now Pat. No. 8,329,363.

(30) Foreign Application Priority Data

Oct. 30, 2009 (KR) .......................... 10-2009-0104504

(51) Int. Cl.
  *G03F 1/26* (2012.01)
  *G03F 1/32* (2012.01)

(52) U.S. Cl.
  CPC ... *G03F 1/26* (2013.01); *G03F 1/32* (2013.01)
  USPC .............................................................. 430/5

(58) Field of Classification Search
  CPC .......... G03F 1/26; G03F 1/144; G03F 1/0046
  USPC ..................................... 430/5, 322, 323, 394
  See application file for complete search history.

(56) References Cited

U.S. PATENT DOCUMENTS

| | | | |
|---|---|---|---|
| 7,678,509 B2 | 3/2010 | Suda | 430/5 |
| 2001/0009745 A1* | 7/2001 | Kim | 430/5 |
| 2005/0069788 A1* | 3/2005 | Tanaka et al. | 430/5 |

FOREIGN PATENT DOCUMENTS

| | | |
|---|---|---|
| JP | 2001-188335 | 7/2001 |
| JP | 2008-102402 | 5/2008 |
| JP | 2009-080510 | 4/2009 |
| KR | 100166854 B1 | 9/1998 |

* cited by examiner

*Primary Examiner* — Stephen Rosasco
(74) *Attorney, Agent, or Firm* — Myers Bigel Sibley & Sajovec, P.A.

(57) ABSTRACT

Halftone phase shift photomasks are provided including a substrate configured to transmit light; a shift pattern on the substrate, the shift pattern including a pattern area on a center portion of the substrate and a blind area disposed on a periphery of the substrate, the shift pattern of the blind area having a greater thickness than a thickness that of the pattern area, and being configured to partially transmit the light; and a light shielding pattern formed on the shift pattern in the blind area and being configured to shield the light. Related methods are also provided herein.

19 Claims, 7 Drawing Sheets

HALFTONE PHASE SHIFT BLANK PHOTOMASKS AND HALFTONE PHASE SHIFT PHOTOMASKS

CLAIM OF PRIORITY

This application is a continuation of U.S. application Ser. No. 12/909,395, filed Oct. 21, 2010 (now U.S. Pat. No. 8,329,363), which claims priority to Korean Patent Application No. 10-2009-0104504, filed Oct. 30, 2009, the contents of which are hereby incorporated herein by reference as if set forth in its entirety.

FIELD

The present inventive concept generally relates to semiconductor devices and, more particularly, to halftone phase shift blank photomasks, halftone phase shift photomasks, and related methods.

BACKGROUND

Generally, photolithography technology is used to form various patterns of a semiconductor device on a wafer. As semiconductor devices become more highly integrated, contact patterns or interconnection patterns are becoming smaller, and thus making it more difficult to use conventional photomasks and photolithography technology. Halftone phase shift photomasks may be used to address some of the difficulties with conventional technologies.

SUMMARY

Some embodiments of the inventive concept provide halftone phase shift blank photomasks, halftone phase shift photomasks, and methods of manufacturing the same in which a light shielding layer can become a thin film to improve the resolution of a fine pattern.

Further embodiments of the inventive concept provide methods of forming halftone phase shift photomasks, the method including preparing a blank photomask, the blank photomask including a shift layer, a light shielding layer, and a first resist layer stacked on a substrate; patterning the first resist layer to expose portions of the light shielding layer in a pattern area of the substrate and to cover portions of the light shielding layer in a blind area of the substrate by exposing and developing the first resist layer; selectively removing the light shielding layer using the patterned first resist layer as an etch mask to provide a light shielding pattern selectively exposing the shift layer; selectively removing the exposed shift layer using the light shielding pattern as an etch mask to form a half shift pattern that does not expose a surface of the substrate; forming a second resist layer on the light shielding pattern and the half shift pattern; patterning the second resist layer to provide a second resist pattern on a portion of the light shielding pattern and the half shift pattern by exposing and developing the second resist layer; removing a portion of the light shielding pattern in the pattern area of the substrate according to the second resist pattern to expose the half shift pattern; and partially removing the half shift pattern using a remaining portion of the light shielding pattern as an etch mask to form a second shift pattern in the pattern area of the substrate, the second shift pattern having a thickness that is smaller than a thickness of the first shift pattern on a blind area of the substrate.

In still further embodiments, selectively removing the exposed shift layer may be preceded by removing the patterned first resist layer and partially removing the half shift pattern may be preceded by removing the second resist pattern.

In some embodiments, the half shift pattern may define a half shift opening; the shift layer may be an etch target layer; forming the half shift pattern may include half-etching the shift layer in the half shift opening; half-etching the shift layer may include only partially etching the shift layer; and the remaining portion of the shift layer may remain on the substrate such that the substrate is not exposed through the remaining portion of the shift layer.

In further embodiments, forming the half shift pattern may include etching the shift layer such that a portion of the shift layer remains in a half shift opening defined by the half shift pattern by a difference between the thickness of the first shift pattern and the thickness of the second shift pattern. In certain embodiments, forming the second shift pattern may include reducing the thickness of the second shift pattern such that the thickness of the second shift pattern is smaller than a thickness of one of the half shift pattern and the thickness of the first shift pattern by a difference between the thickness of the first shift pattern and the thickness of the second pattern.

In still further embodiments, forming the second shift pattern may include etching the second shift pattern to define a second shift pattern opening without exposing any portion of the substrate.

In some embodiments, the thickness of the second shift pattern may be half of one of a thickness of the half shift pattern and a thickness of the first shift pattern.

In further embodiments, the substrate may be a transparent substrate.

Still further embodiments of the inventive concept provide methods of forming a halftone phase shift photomask, the method including forming a shift layer on a surface of a substrate; forming a light shielding layer on a surface of the shift layer; forming a first resist layer on a surface of the light shielding layer; forming a first resist pattern including a blind area and a pattern area of the substrate by performing a first exposure and development process on the first resist layer; etching the light shielding layer to provide a light shielding pattern using the first resist pattern as an etch mask; half-etching the shift layer using the light shielding pattern as an etch mask to form a half shift pattern that defines a half shift opening; forming a second resist layer on the light shielding pattern and the half shift pattern; forming a second resist pattern opening in the pattern area of the substrate by performing a second exposure and development process on the second resist layer; etching the light shielding layer according to the second resist pattern and removing the light shielding pattern in the pattern area of the substrate; and performing a partial etching process using the light shielding pattern in the blind area of the substrate as an etch mask to provide a first shift pattern in the blind area of the substrate and a second shift pattern in the pattern area of the substrate, such that the first and second shift patterns have different thicknesses.

In some embodiments of the inventive concept, half etching the shift layer may be preceded by removing the first resist pattern and performing a partial etching process may be preceded by removing the second resist pattern.

In further embodiments of the inventive concept, forming the half shift pattern may include half-etching the shift layer until a depth of the half shift opening in the shift layer is substantially the same as a thickness of the second shift pattern.

In still further embodiments of the inventive concept, forming the half shift pattern may include half-etching the shift layer until a height of a remaining portion of the shift layer in the half shift opening is substantially the same as a difference between a thickness of the half shift pattern and the thickness of the second shift pattern.

In some embodiments, forming the second shift pattern may include etching the shift layer until a thickness of the half shift pattern is reduced to the thickness of the second shift pattern so that the half shift pattern becomes the second shift pattern and a remaining portion of the shift layer in the half shift opening may be removed such that the half shift opening becomes a second shift opening.

In further embodiments, the method may include etching the half-shift opening such that a surface of the substrate exposed through a bottom surface of the half shift opening.

Still further embodiment provide halftone phase shift photomasks including a substrate configured to transmit light; a shift pattern on the substrate, the shift pattern including a pattern area on a center portion of the substrate and a blind area disposed on a periphery of the substrate, the shift pattern of the blind area having a greater thickness than a thickness that of the pattern area, and being configured to partially transmit the light; and a light shielding pattern formed on the shift pattern in the blind area and being configured to shield the light.

In some embodiments, the shift pattern in the pattern area may have a transmittance of from about 1.0 percent to about 30 percent to the light and maintains a phase difference of about 180° to the light for phase shift between the shift pattern and a shift opening defined by the shift pattern and the shift pattern in the blind area may provide an optical density of greater than about 2.5 for light shielding.

In further embodiments, the thickness of the shift pattern in the blind area may be from about 1.5 times to about 2.5 times the thickness of the shift pattern in the pattern area.

In still further embodiments, the thickness of the shift pattern and a thickness of the light shielding pattern may vary according to materials used for the shift pattern and the light shielding pattern and a sum of the thicknesses of the light shielding pattern and the shift pattern in the blind area may be greater than about 1090 Å.

In some embodiments, a thickness of the light shielding pattern in the blind area may be from about 100 Å to about 160 Å.

In further embodiments, the shift pattern may include molybdenum silicon oxynitride (MoSiON), the light shielding pattern may include Chromium (Cr) and a wavelength may be 193 nm, the MoSiON shift pattern in the blind area may have a thickness of about 1320 Å, the MoSiON shift pattern in the pattern area may have a thickness of about 660 Å and the Cr light shielding pattern may have a thickness of about 160 Å.

In still further embodiments, an optical density of the blind area may be about 3.0 when light has a wavelength of about 193 nm.

Some embodiments provide a halftone phase shift blank photomask including a transparent substrate; a molybdenum silicon oxynitride (MoSiON) shift layer stacked on the transparent substrate and having a thickness of from about 930 Å to about 1320 Å; a Chromium (Cr) light shielding layer stacked on the shift layer and having a thickness of from about 100 Å to about 160 Å; and a resist layer stacked on the light shielding layer and having a thickness of from about 1000 Å to about 1200 Å.

In further embodiments, a sum of the thicknesses of the shift layer and the light shielding layer may be greater than about 1090 Å with an optical density of greater than about 3.0.

In still further embodiments, the pattern may be provided in the resist layer and have an aspect ratio of leas than about 1:2.5.

In some embodiments, the transparent substrate may include one of glass or quartz.

BRIEF DESCRIPTION OF THE DRAWINGS

The foregoing and other features and advantages of the inventive concepts will be apparent from the more particular description embodiments of the inventive concepts, as illustrated in the accompanying drawings in which like reference characters refer to the like elements throughout the different views. The drawings are not necessarily to scale, emphasis instead being placed upon illustrating the principles of the inventive concepts. In the drawings.

DETAILED DESCRIPTION OF EMBODIMENTS

Figure 1:
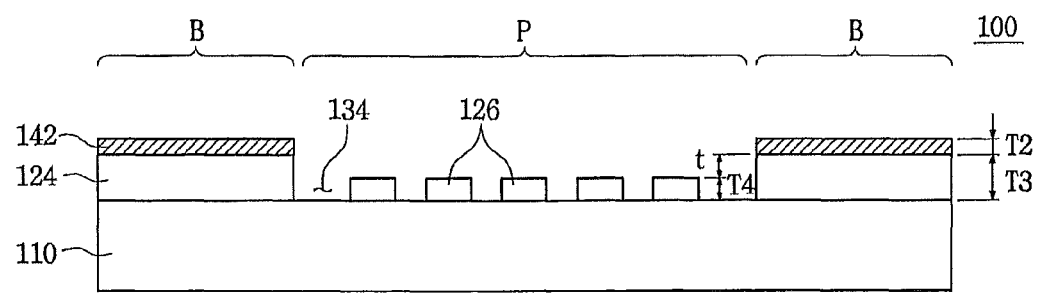
FIG. 1 is a cross section of a halftone phase shift photomask according to some embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be discussed further herein with respect to FIGS. 1 through 6H, embodiments the present inventive concept relate to halftone phase shift blank photomasks, halftone phase shift photomasks, and related methods of fabrication.

Figure 2:
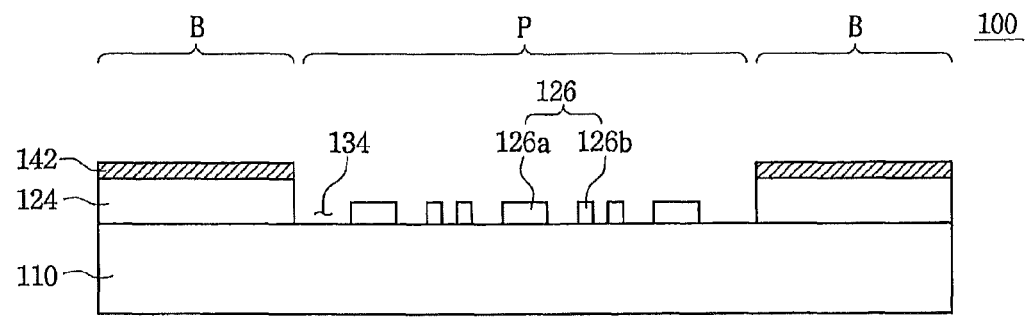
FIG. 2 is a cross section of a halftone phase shift photomask having a sub-resolution assist feature (SRAF) pattern according to some embodiments of the inventive concept.
Figure 3:
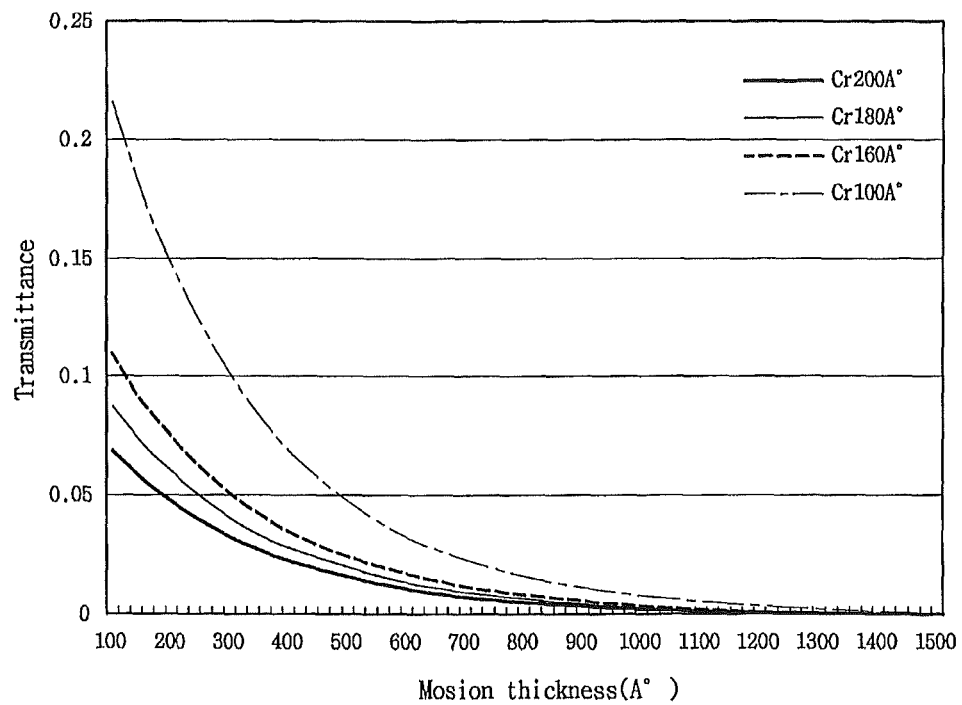
FIG. 3 is a graph illustrating the relationship between thicknesses of molybdenum silicon oxynitride (MoSiON) and Chromium (Cr) and optical transmittance in a blind area according to some embodiments of the inventive concept.
Figure 4:
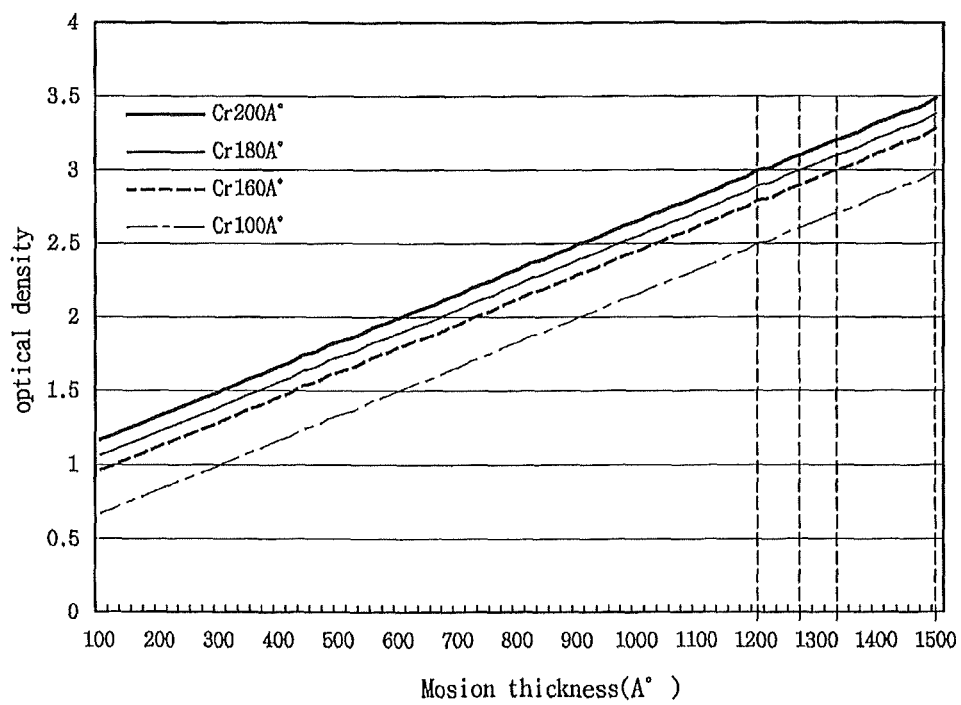
FIG. 4 is a graph illustrating the relationship between the thicknesses of MoSiON and Cr and optical density in a blind area according to some embodiments of the inventive concept.

FIG. 1 is a cross section illustrating a halftone phase shift photomask according to some embodiments of the inventive concept. FIG. 2 is a cross section of a halftone phase shift photomask having a sub-resolution assist feature (SRAF) pattern according to some embodiments of the inventive concept. FIG. 3 is a graph illustrating the relationship between the thicknesses of molybdenum silicon oxynitride (MoSiON) and Chromium (Cr) and optical transmittance in a blind area according to some embodiments of the inventive concept. FIG. 4 is a graph illustrating the relationship between the thicknesses of MoSiON and Cr and optical density in a blind area according to some embodiments of the inventive concept.

Referring first to FIG. 1, a photomask 100 includes a pattern area P disposed at the center thereof and a blind area B disposed around the pattern area P. The pattern area P includes a main pattern 126, such as a circuit pattern (e.g., a contact pattern or interconnection pattern), to be transferred to a wafer. The blind area B may include an alignment key (not shown) by which the photomask 100 is aligned with an exposure apparatus.

As further illustrated in FIG. 1, the photomask 100 includes a transparent substrate 110 adapted to transmit the light, a light shielding pattern 142 adapted to shield the light, and shift patterns 124 and 126 interposed between the transparent substrate 110 and the light shielding pattern 142 and adapted to transmit the light in a predetermined ratio. The shift patterns 124 and 126 include a first shift pattern 124 disposed in the blind area B and a second shift pattern 126 disposed in the pattern area P.

Meanwhile, the blind area B has a transmittance of about zero percent to reduce, or possibly prevent, the light from being transmitted through the edge of the photomask 100 during exposure, thereby functioning to form a precise pattern on the wafer. Thus, an optical density of the blind area B may be greater than about 2.5 to reduce, or possibly prevent, unnecessary light from being transmitted to the wafer during exposure, and may be greater than about 3.0 for safety in some embodiments.

Furthermore, thin film loss of the blind area B inevitably occurs due to repeated use or periodic cleaning. Thus, the thickness of the light shielding pattern 142 gradually decreases, and it may be difficult to ensure an optical density. For example, when a wavelength λ of the light is 193 nm, the sum of the thickness of the light shielding pattern 142 and the thickness of the first shift pattern 124 is about 1090 Å or more in the blind area B to increase the likelihood of an optical density of 2.5 or more. However, the thickness of the light shielding pattern 142 does not typically exceed 160 Å in the blind area B.

Referring now to FIG. 2, the second shift pattern 126 has first and second portions in the pattern area P, a main pattern portion 126a and an SRAF portion 126b. To increase the resolution of the main pattern 126a, an SRAF pattern 126b may be additionally used. An SRAF pattern 126b is an auxiliary pattern of a limited resolution or less, and functions to correct an optical proximity effect (OPE).

As a design rule decreases, forming of the main pattern 126a becomes important to improve the degree of integration of semiconductor devices. However, since the width of a critical dimension of the SRAF pattern 126b is smaller than that of a critical dimension of the main pattern 126a, it is important to form the SRAF pattern 126b, and it is more difficult to increase the resolution of the SRAF pattern 126b. For example, since the width of a critical dimension of the SRAF pattern 126b is reduced to about half the width of a critical dimension of the main pattern 126a with decrease in design rule, it is difficult to form the SRAF pattern 126b using current photomask manufacturing technology. Thus, when a photomask is manufactured, it is very important to set several exposure conditions to stably form the SRAF pattern 126b.

Although a thick light shielding layer may be used to increase the likelihood of an optical density of 2.5 or more in the blind area B, as mentioned above, a resist layer sufficiently thick in proportion to the light shielding layer is used to etch the thick light shielding layer. However, when a thick resist pattern (see 152 of FIG. 6A) is used, and an aspect ratio of the SRAF pattern 126b is 1:2.5 (bottom:height) or more, the SRAF pattern 126b easily collapses. In particular, this is remarkable in a 45 nm pattern manufacturing process. Thus, there is a predetermined limit to increasing a thickness T1 of a first resist layer (see 150 of FIG. 5). When the thickness T1 of the first resist layer 150 exceeds 1500 Å, it is difficult to form a fine pattern. To set the aspect ratio of the SRAF pattern 126b to 1:2.5 or less, the thickness T1 of the first resist layer 150 may be determined within a range of from about 1000 Å to about 1200 Å.

As described above, a thickness T2 of a light shielding layer (see 140 of FIG. 5) may also need to be reduced to satisfy the requirements of a thin film resist. Thus, the thickness T2 of the light shielding layer 140 may be determined within a range of from about 100 Å to about 160 Å.

Furthermore, while the thickness T2 of the light shielding pattern 142 needs to be reduced, the overall thickness T2+T3 of the blind area B needs to be increased. To achieve these conflicting goals, the thickness T2 of the light shielding pattern 142 is reduced and a thickness T3 of the first shift pattern 124 is increased at least in the blind area B. The thickness T3 of the first shift pattern 124 is greater than about 930 Å.

The thickness T3 of the first shift pattern 124 in the blind area B is different from a thickness T4 of the second shift pattern 126 in the pattern area P. The thickness T4 of the second shift pattern 126 may not exceed 720 Å, unlike the first shift pattern 124. The thickness T4 of the second shift pattern 126 may be determined to be about 660 Å so that light maintains a phase difference of from about 90° to about 270° between the second shift pattern 126 having a transmittance of from about 1.0% to about 30% to the light and a second shift opening 134 defined by the shift pattern 126.

Furthermore, as semiconductor devices become highly integrated and the design rule decreases, the main pattern 126a and the SRAF pattern 126b are also being reduced in size and becoming thinner in proportion to the changes. Thus, according to such a demand for thin films, the thickness T4 of the second shift pattern 126 tends to be gradually reduced from about 720 Å to about 590 Å or about 480 Å. In particular, to realize a phase difference of 180° when MoSiON is used for the second shift pattern 126 and quartz is used for the transparent substrate 110, the second shift pattern 126 has a thickness of about 660 Å.

According to materials used for the first shift pattern 124 and the light shielding pattern 142, the thickness of each pattern for ensuring an optical density may vary. Thus, in some embodiments of the inventive concept, the relationship between the optical density and the thickness of each pattern may be observed when MoSiON is used for the shift patterns 124 and 126 and Cr is used for the light shielding pattern 142.

For example, when MoSiON is used for the first shift pattern 124 and Cr is used for the light shielding pattern 142, the optical density may be calculated according to a thickness D of MoSiON and a thickness d of Cr under the condition of the light having the wavelength λ 193 nm by the following equations:

$$\text{transmittance} = \exp(-2\pi/\lambda \times 2k \times \text{thickness}) \quad \text{Equation 1}$$

$$\text{optical density} = \log(-\Delta \text{transmittance}) \quad \text{Equation 2}$$

Since a refractive index n of MoSiON is 2.343, an attenuation constant k of MoSiON is 0.586, a refractive index of Cr is 1.477, and an attenuation constant k of Cr is 1.762, a graph of FIG. 3 can be obtained by calculating optical transmittance using equation 1. Also, a graph of FIG. 4 can be obtained by calculating optical density using equation 2.

Referring now to FIG. 4, by appropriately changing the thicknesses of MoSiON and Cr, the optical density of the blind area B can be adjusted. For example, when the thickness of MoSiON is 1200 Å and the thickness of Cr is increased from 100 Å to 160 Å, 180 Å, and then 200 Å, the optical density increases from 2.5 to 3.0. On the other hand, when the thickness of Cr is 160 Å and the thickness of MoSiON is increased from 1200 Å to 1300 Å, the optical density increases from 2.7 to 3.0. In particular, when the thickness of MoSiON doubles from a generally used value of 660 Å to 1320 Å, it is possible to ensure an optical density of 3.0 or more even under the condition of the thickness of Cr being 160 Å.

As discussed above, when the thickness T3 of MoSiON in the blind area B is 1320 Å and the thickness T4 of MoSiON in the pattern area P is 660 Å, it is possible to realize a phase difference of 180° in the pattern area P while ensuring an optical density of 3.0 or more in the blind area B because the thickness T3 of MoSiON in the blind area B becomes at least two times the thickness T4 of MoSiON in the pattern area P.

In other words, in some embodiments of the inventive concept, the thickness T4 of the second shift pattern 126 is reduced to form a fine pattern in the pattern area P, and the thickness T3 of the first shift pattern 124 is increased in the blind area B to maintain an optimum optical density, so that the conflicting goals can be achieved.

Halftone phase shift blank photomasks and methods of manufacturing halftone phase shift photomasks according to some embodiments of the inventive concept will be discussed below with reference to drawings.

Figure 5:
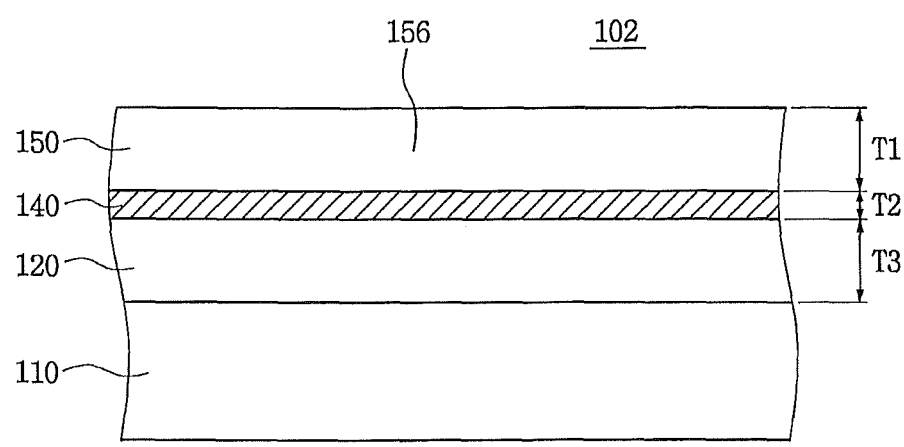
FIG. 5 is a cross section of a halftone phase shift blank photomask.

FIG. 5 is a cross section of a halftone phase shift blank photomask and FIGS. 6A to 6H are cross sections illustrating processing steps in the fabrication of halftone phase shift photomask in accordance with some embodiments of the inventive concept. Referring first to FIG. 5, a blank photomask 102 includes the transparent substrate 110, a shift layer 120 stacked on the transparent substrate 110, the light shielding layer 140 stacked on the shift layer 120, and the first resist layer 150 stacked on the light shielding layer 140. Although not shown in the drawing, an anti-reflective layer (ARL) may be additionally included on the light shielding layer 140 in some embodiments. The transparent substrate 110 may be a transparent crystalline quartz (Qz) or glass through which light can be transmitted.

To transmit light on the transparent substrate 110, the shift layer 120 may include a material such as molybdenum silicon nitride (MoSiN), molybdenum silicon carbonitride (MoSiCN), molybdenum silicon oxynitride (MoSiON), or molybdenum silicon carbon oxynitride (MoSiCON). In embodiments where MoSiON is used, the shift layer 120 may be formed to a thickness of from about 930 Å to about 1320 Å to ensure an optical density.

Chromium (Cr), chromium carbide (CrC), chromium nitride (CrN), chromium carbonitride (CrCN), etc. may be used for the light shielding layer 140. In embodiments where Cr is used, the light shielding layer 140 may be formed to a thickness of from about 100 Å to about 160 Å to implement the thin first resist layer 150.

In some embodiments, a positive or negative photosensitive film may be used as the first resist layer 150. The first resist layer 150 have a thickness of from about 1000 Å to about 1200 Å to improve the resolution of a pattern and reduce the size of the pattern.

Figure 6A:
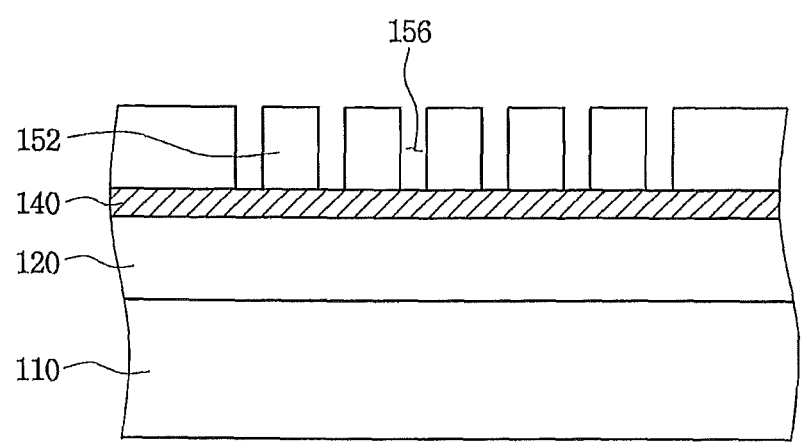
FIGS. 6A-6H are cross sections illustrating processing steps in the fabrication of halftone phase shift photomask in accordance with some embodiments of the inventive concept.

Referring now to FIG. 6A, a first exposure and development process is performed on the first resist layer 150 using an electron beam. The first resist layer 150 may be selectively patterned to form a first resist pattern 152 in the pattern area P. The first resist pattern 152 defines a first resist opening 156, and may be formed as a hole type to form a contact pattern or formed as a line-and-space type to form an interconnection pattern.

Figure 6B:
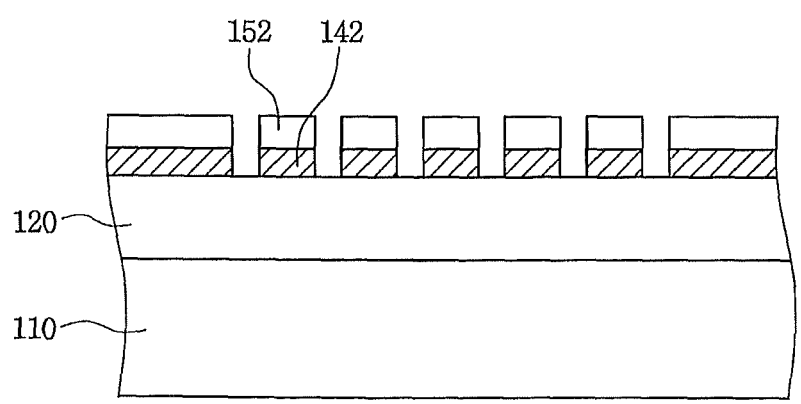

Referring now to FIG. 6B, the light shielding layer 140 is dry-etched using the first resist pattern 152 as an etch mask. The light shielding pattern 142 that selectively exposes the shift layer 120 is formed.

Figure 6C:
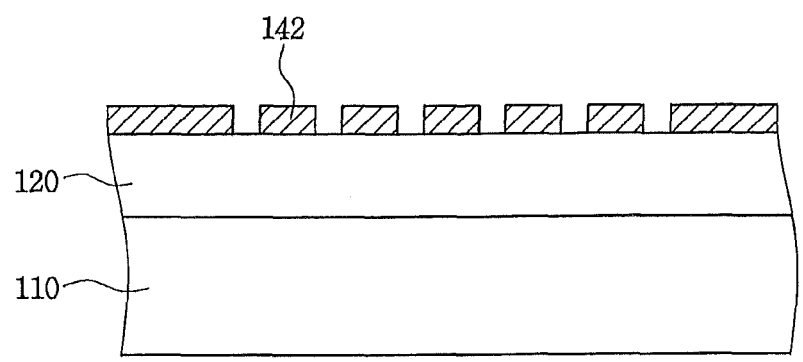
Figure 6D:
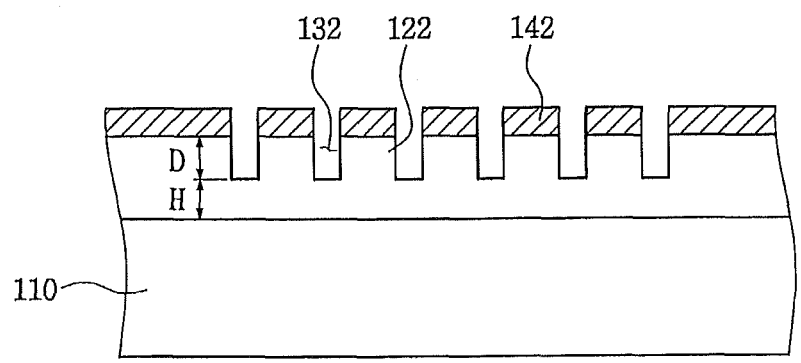

As illustrated in FIG. 6C, the first resist pattern 152 is stripped and cleaned and the shift layer 120 is partially or half-etched using the light shielding pattern 142 as a hard mask, thereby forming a half shift pattern 122 that defines the half shift opening 132 as illustrated in FIG. 6D. As used herein, "half" refers to partial or less than all and not necessarily 50% or ½. Here, the degree of half-etching is a ratio in which the shift layer 120, an etch target layer, is partially, but not completely, etched. Thus, the degree of half-etching may denote that a portion of the shift layer 120 in the half shift opening 132 left without being etched has a height equal to a difference t between the thickness T3 of the first shift pattern 124 in the blind area B and the thickness T4 of the shift pattern 126 in the pattern area P as illustrated in FIG. 1.

Like the first resist pattern 152, the half shift pattern 122 may be formed as a predetermined contact pattern or interconnection pattern. Here, the half shift pattern 122 has the thickness T3, which is thicker than the thickness T4 of the second shift pattern 126 to be formed in the later process (FIG. 6H), by the difference t. Thus, the half shift opening 132 does not expose a surface of the transparent substrate 110.

At this time, an etching end time may be appropriately set to determine a ratio in which a part of the shift layer 120 is recessed, that is, the degree of half-etching. The recess end time will be a time point (D=T4) when a depth D of the half shift opening 132 recessed by the etching process becomes the same as the thickness T4 of the second shift pattern 126 to be formed in the pattern area P by the later process (FIG. 6H), and a time point (H=T3−T4=t) when a height H remained after the recess process becomes the same as corresponding to a difference t between the thickness T3 of the half shift pattern 122 and the thickness T4 of the second shift pattern 126 resulting from the later process. Since a technique for selecting and detecting an etching process time in an etching process has been well known already, a detailed description of the technique will be omitted.

In embodiments of the inventive concept where the degree of half-etching is determined to be half the thickness of the shift layer 120, the depth D of the half shift opening 132 becomes the same as the height H left after the recess process, and the thickness T4 of the second shift pattern 126 becomes half the thickness T3 of the half shift pattern 122. Then, the thickness T3 of the first shift pattern 124 in the blind area B may be double the thickness T4 of the second shift pattern 126 in the pattern area P, an optical density in the blind area B may be 3.0 or more, and a phase difference in the pattern area P may be 180°. For convenience, the degree of half-etching is ½ in the drawings, however, embodiments are not limited to this configuration.

Figure 6E:
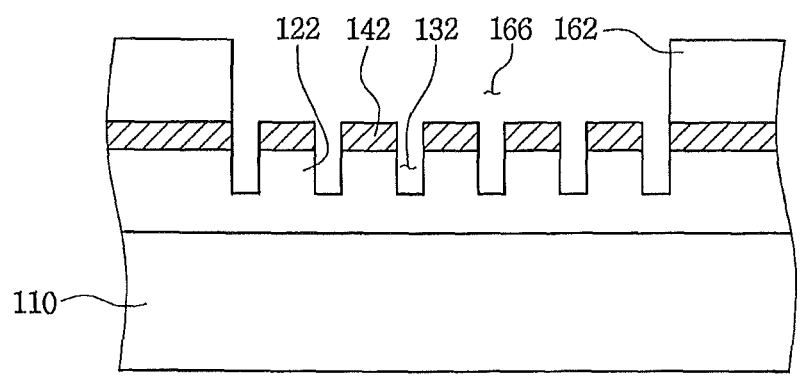

Referring now to FIG. 6E, a second resist layer (not shown) is stacked, and a photolithography process of opening the pattern area P is performed. In other words, a second exposure and development process is performed on the second resist layer to form a second resist pattern 162 defining a second resist opening 166.

Figure 6F:
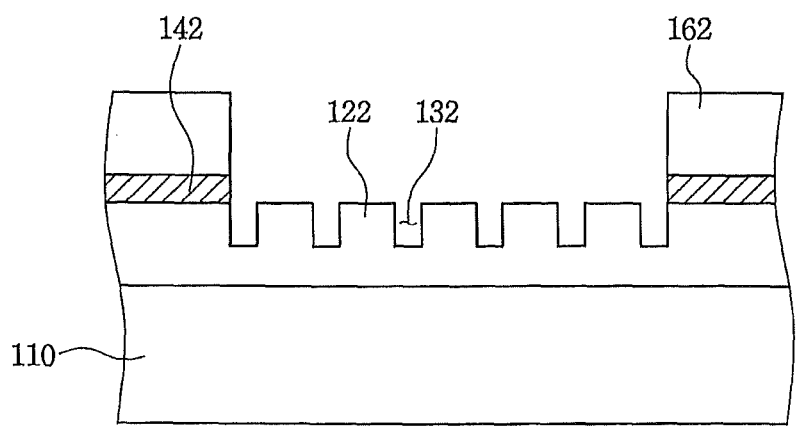
Figure 6G:
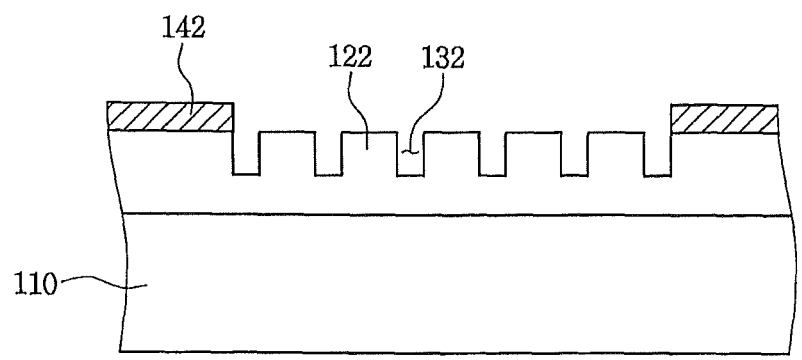

As illustrated in FIG. 6F, an etching process is performed using the second resist pattern 162 as an etch mask to strip the light shielding pattern 142 in the pattern area P. The second resist pattern 162 is stripped as illustrated in FIG. 6G. The light shielding pattern 142 in the blind area B remains as is.

Figure 6H:
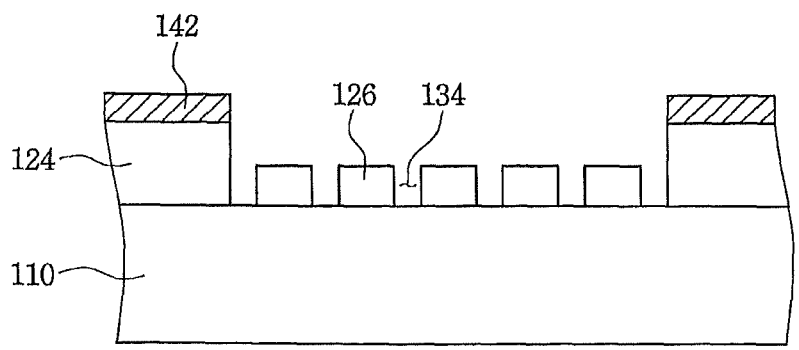

Referring now to FIG. 6H, an etching process is performed using the light shielding pattern 142 in the blind area B as an etch mask to reduce the height of the half shift pattern 122 in the pattern area P. Thus, the second shift pattern 126 is formed in the pattern area P. In particular, the half shift pattern 122 in the pattern area P is removed by the thickness t, so that the thickness T4 of the half shift pattern 122 is reduced to the thickness T3 of the second shift pattern 126 and the thickness T3 of the portion in the half shift opening 132 is substantially removed. As a result, the second shift opening 134 is formed, and the transparent substrate 110 is exposed.

When the etching end time is appropriately set, the substrate 110 may be exposed through the half shift opening 132. The etching end time in the etching process may be a time point when the transparent substrate 110 is exposed through the bottom surface of the half shift opening 132 formed while the etching process is performed.

As discussed above, the following effects can be expected according to some embodiments of the inventive concept. First, a shift pattern in a blind area may become thicker than a conventional shift pattern to increase the likelihood of an optical density of 3.0 or more, and the thickness of the shift pattern in a pattern area is maintained as is to realize a phase difference of 180°. Second, since the shift pattern in the blind area becomes thicker, the likelihood of an optical density can be increased as is, and as a result, a light shielding pattern can become a thin film. Third, since the light shielding pattern becomes a thin film, a resist layer functioning as a mask can also become a thin film, and the resolution of the pattern can be improved.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A halftone phase shift photomask, comprising:
   a substrate configured to transmit light, the substrate having a pattern area disposed at a center of the substrate and a blind area at a periphery of the substrate;
   a shift pattern on the substrate, the shift pattern including a first shift pattern on the blind area and a second shift pattern on the pattern area the first shift pattern thicker than the second area, and being configured to partially transmit the light; and
   a light shielding pattern formed on the shift pattern in the blind area and being configured to shield the light, wherein the second shift pattern comprises a main portion and a sub-resolution assist feature (SRAF) portion, the SRAF portion being smaller than the main portion.

2. The halftone phase shift photomask of claim 1, wherein the shift pattern in the pattern area has a transmittance of from about 1.0 percent to about 30 percent to the light and maintains a phase difference of about 180° to the light for phase shift between the shift pattern and a shift opening defined by the shift pattern and wherein the shift pattern in the blind area provides an optical density of greater than about 2.5 for light shielding.

3. The halftone phase shift photomask of claim 1, wherein the thickness of the shift pattern in the blind area is from about 1.5 times to about 2.5 times the thickness of the shift pattern in the pattern area.

4. The halftone phase shift photomask of claim 1, wherein the thickness of the shift pattern and a thickness of the light shielding pattern vary according to materials used for the shift pattern and the light shielding pattern and wherein a sum of the thicknesses of the light shielding pattern and the shift pattern in the blind area is greater than about 1090 Å.

5. The halftone phase shift photomask of claim 1, wherein a thickness of the light shielding pattern in the blind area is from about 100 Å to about 160 Å.

6. The halftone phase shift photomask of claim 1, wherein the shift pattern comprises molybdenum silicon oxynitride (MoSiON), wherein the light shielding pattern comprises Chromium (Cr) and wherein a wavelength is 193 nm, the MoSiON shift pattern in the blind area has a thickness of about 1320 Å, the MoSiON shift pattern in the pattern area has a thickness of about 660 Å and the Cr light shielding pattern has a thickness of about 160 Å.

7. The halftone phase shift photomask of claim 6, wherein an optical density of the blind area is about 3.0 when light has a wavelength of about 193 nm.

8. A halftone phase shift blank photomask, comprising:
a transparent substrate;
a molybdenum silicon oxynitride (MoSiON) shift layer stacked on the transparent substrate and having a thickness of from about 930 Å to about 1320 Å;
a Chromium (Cr) light shielding layer stacked on the shift layer and having a thickness of from about 100 Å to about 160 Å; and
a resist layer stacked on the light shielding layer and having a thickness of from about 1000 Å to about 1200 Å.

9. The halftone phase shift blank photomask of claim 8, wherein a sum of the thicknesses of the shift layer and the light shielding layer is greater than about 1090 Å with an optical density of greater than about 3.0.

10. The halftone phase shift blank photomask of claim 9, wherein the transparent substrate comprises one of glass or quartz.

11. The halftone phase shift blank photomask of claim 8, wherein when a pattern is provided in the resist layer, the pattern has an aspect ratio of less than about 1:2.5.

12. A halftone phase shift photomask comprising:
a transparent substrate having a pattern area on a center portion of the substrate and a blind area on a peripheral portion of the substrate, the blind area surrounding the pattern area;
a first shift pattern in the blind area and a plurality of second shift patterns in the pattern area; and
first openings between the first shift pattern and the second shift patterns, the opening exposing an upper surface of the transparent substrate,
wherein the upper surface of the transparent substrate is fully flat; and
wherein the first shift pattern is thicker than the second shift patterns.

13. The halftone phase shift photomask of claim 12, wherein the first shift pattern and the second shift patterns are spaced apart from each other.

14. The halftone phase shift photomask of claim 12, wherein the second shift pattern has a main pattern and a sub-resolution assist feature portion, the sub-resolution assist feature portion being smaller than the main portion.

15. The halftone phase shift photomask of claim 12, further comprising a light shielding pattern on the first shift pattern.

16. The halftone phase shift photomask of claim 12, wherein the transparent substrate is one of glass and quartz.

17. The halftone phase shift photomask of claim 12, wherein the first shift pattern and the second shift pattern comprise molybdenum silicon oxynitride (MoSiON).

18. The halftone phase shift photomask of claim 12, wherein the light shielding pattern comprises chromium (Cr).

19. The halftone phase shift photomask of claim 12, further comprising a plurality of second openings between the second shift patterns, the second openings exposing the upper surface of the substrate.

* * * * *